United States Patent
Brown et al.

(10) Patent No.: US 12,532,423 B1
(45) Date of Patent: Jan. 20, 2026

(54) LATCHING WITH DRAWER MOVEMENT IN COMPUTING SYSTEM ASSEMBLIES

(71) Applicant: Amazon Technologies, Inc., Seattle, WA (US)

(72) Inventors: Aaron Michael Brown, Washington, DC (US); Justin Knowles, Arlington, VA (US); John Chung King Kan, Arlington, VA (US); William Mark Megarity, Renton, WA (US)

(73) Assignee: Amazon Technologies, Inc., Seattle, WA (US)

( * ) Notice: Subject to any disclaimer, the term of this patent is extended or adjusted under 35 U.S.C. 154(b) by 146 days.

(21) Appl. No.: 18/374,486

(22) Filed: Sep. 28, 2023

(51) Int. Cl.
*H05K 5/02* (2006.01)

(52) U.S. Cl.
CPC ........... *H05K 5/0221* (2013.01); *H05K 5/023* (2013.01)

(58) Field of Classification Search
CPC .............................. H05K 5/0221; H05K 5/023
USPC ........................................................ 361/724
See application file for complete search history.

(56) References Cited

U.S. PATENT DOCUMENTS

| | | | | |
|---|---|---|---|---|
| 5,848,906 A * | 12/1998 | Glusker | ............... | H01R 13/629 439/157 |
| 6,625,035 B1 * | 9/2003 | Steinman | ............. | H05K 7/1429 361/740 |
| 7,495,931 B2 * | 2/2009 | Clark | .................. | H05K 7/1425 361/802 |
| 7,558,075 B2 * | 7/2009 | Nguyen | ................. | G06F 1/181 361/801 |

\* cited by examiner

*Primary Examiner* — Hung S. Bui
(74) *Attorney, Agent, or Firm* — Kilpatrick Townsend & Stockton LLP (57) ABSTRACT

A computing system assembly can include a drawer defining an interior volume sized for holding a computing appliance. The drawer can be slidable between a deployed state and a stowed state relative to a rack-mountable chassis slidably receivable in a rack. A drawer latch coupled with the drawer's exterior can be actuatable to release the drawer from being retained in the chassis and to release the drawer for movement from the stowed state toward the deployed state. An appliance latch also coupled with the drawer's exterior can be actuatable in response to movement of the drawer from the stowed state toward the deployed state to move from a secure state in which the appliance latch at least partially blocks access out of the interior volume of the drawer and to an accessible state in which the appliance latch permits access out of the interior volume of the drawer.

20 Claims, 8 Drawing Sheets

LATCHING WITH DRAWER MOVEMENT IN COMPUTING SYSTEM ASSEMBLIES

BACKGROUND

Datacenters contain large amounts of computing equipment, which can include servers and networking hardware such as switches and routers. Some important considerations for datacenters can include how to limit the cost of operating a datacenter and/or how to maintain availability of datacenter computing resources. Often, multiple servers and/or networking hardware components are arranged in racks. Any set up and/or maintenance operation performed relative to a rack may be performed many times across many racks, such that improving a speed and/or effectiveness of a given operation may yield substantial operational gains in reducing costs and/or improving reliability.

BRIEF DESCRIPTION OF THE DRAWINGS

Various embodiments in accordance with the present disclosure will be described with reference to the drawings, in which.

DETAILED DESCRIPTION

Various embodiments herein relate to computing system assemblies that may include a drawer and associated components that may be suitably sized for receiving and containing a server blade or other form of computing appliance. The drawer may facilitate actions to secure and release the drawer and an appliance therein relative to a chassis that may be received in a rack, for example. The drawer may include latches that may enable the appliance to be suitably received and seated within the chassis without reliance on inclusion of external fastening structures or mounting structures installed on the appliance itself.

The latches on the drawer can include a drawer latch that can secure the drawer relative to the chassis. The latches on the drawer can also include an appliance latch that can secure the appliance within the drawer.

In an illustrative example, the drawer latch can include a prong that can engage structure in the chassis to hold the drawer in a stowed state within the chassis. A handle may be actuated so that the prong can be retracted and allow the drawer to be extended to a deployed state. In addition in this illustrative example, the appliance latch can include a claw or a tooth that can actuate into position extending at least partially across an opening of the drawer that the appliance may inserted through in installation and/or pulled out through for removal. In operation, the appliance latch may be situated to be extending open in the extending or deployed state of the drawer. The appliance latch may be biased outward (such as by a torsional spring or other biasing member) to provide access for installation or removal of the computing appliance through the front opening of the drawer in use. Pushing the drawer into the chassis may cause the appliance latch to contact a holding surface (such as a wall that bounds the receiving area of the drawer) and may cause the appliance latch to pivot inward so that the tooth on the appliance latch can extend at least partially across the front opening of the drawer and secure the appliance in place while the drawer is received in the chassis. Thus, more generally, in a stowed state of the drawer, the appliance latch may be positioned in a secured state, while in an extended state of the drawer, the appliance latch can be positioned in an accessible state (e.g., in response to outward biasing of the appliance latch as the drawer is opened).

In an example sequence of operations, a technician or other user may operate the handle to disengage the prong of the drawer latch and pull open the drawer so that the appliance latch is in the accessible state. The user may then grasp a front of an appliance and push the appliance through a front opening of the drawer until contacting a rear of the drawer with the appliance. The user may continue pushing the front of the appliance so that the drawer begins to slide into the chassis. Pushing the drawer bearing the appliance into the chassis can reposition and/or trigger actuation of the drawer latch and the appliance latch. For example, pushing the drawer into the chassis may cause the prong of the drawer latch to pop into engagement with structure in the chassis, and the same pushing of the drawer into the chassis may also cause the appliance latch to contact chassis structure that will make the appliance latch pivot into a secured state for keeping the appliance secured in the drawer. More generally, a single motion may be utilized to insert the appliance into the drawer and cause the drawer to move backwards into position in the chassis and into a state in which both the drawer and the appliance are secured relative to the chassis (e.g., with the drawer being retained in the chassis by the drawer latch and the appliance being secured in the drawer by the appliance latch). Inserting the appliance can cause the appliance to engage with a connector in the chassis (such as through a gap in a rear wall of the drawer) and may cause the appliance to become operational for use, for example.

In comparison, when the appliance is to be exited or removed from the chassis, the drawer latch can be disengaged (e.g., by operating the handle) to permit the drawer to be extended. In one illustrative example, the drawer latch can be actuated by lateral movements (such as by pushing laterally inward on a handle located on a lateral edge of the drawer to arrive at a laterally offset configuration). Moving the handle to the laterally offset configuration can pull the prong of the drawer latch out of engagement with a drawer catch or drawer catch surface of the chassis, and holding in such laterally offset configuration may keep the prong out of engagement with the drawer latch to enable the drawer to slide out without interference from the drawer latch. With the handle in the laterally offset configuration, the handle can be pulled (e.g., longitudinally) to extract and/or extend the drawer from the chassis. Extending the drawer can move the appliance latch out of contact with a holding surface that kept the appliance latch held in a secure state against the bias of the torsional spring or biasing member. Freeing the appliance latch from the holding surface by extending the drawer can allow the torsional spring or biasing member to cause the appliance latch to automatically disengage and move from the secure state to the accessible state, e.g., such that the appliance can be readily exited or removed from the drawer.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
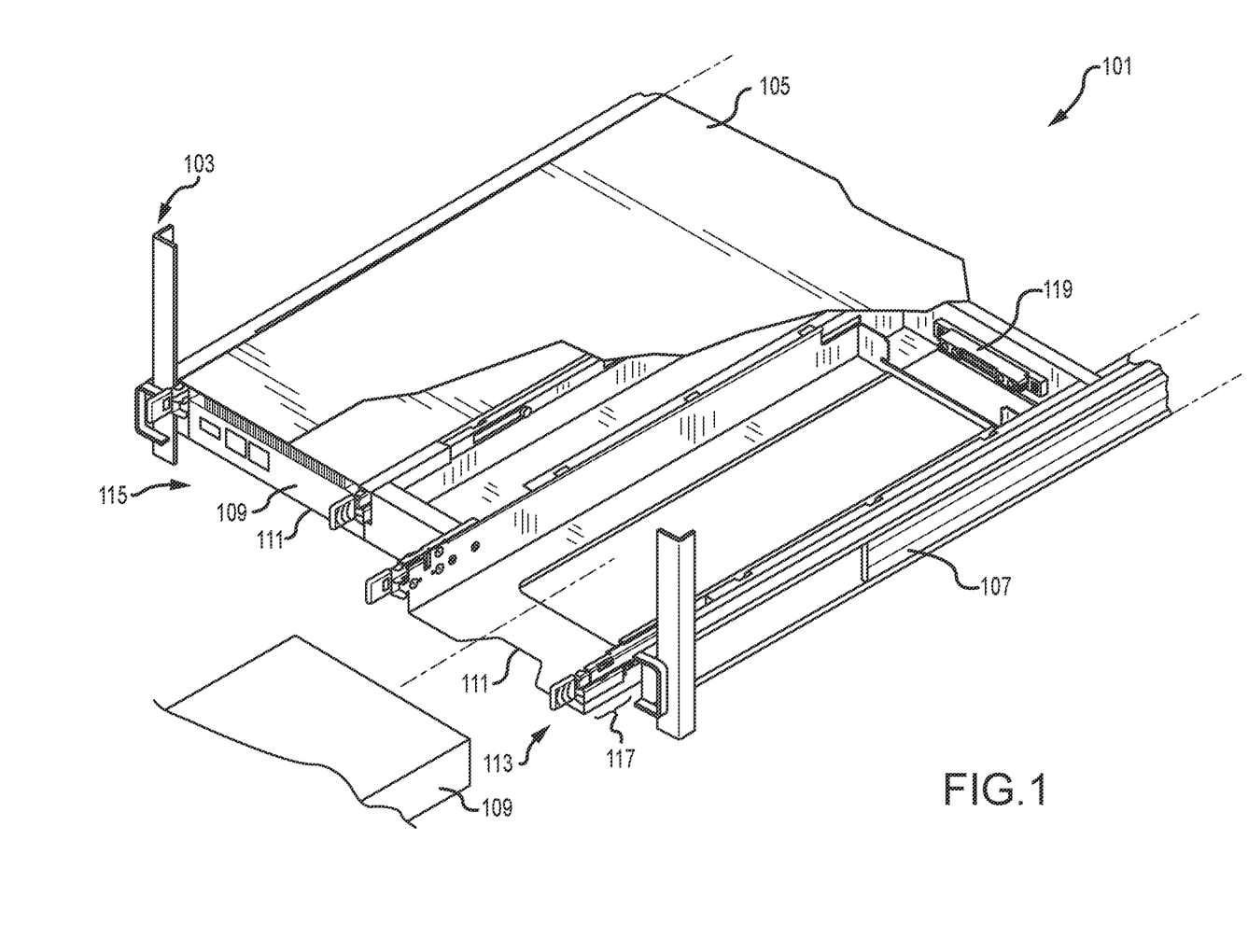
FIG. 1 illustrates elements of a system implemented relative to a chassis received in a rack, in accordance with various embodiments.

FIG. 1 illustrates a system 101, which may be or include a computing system assembly, for example. The system 101 may be included as part of a datacenter or other suitable location with computing assemblies in use.

The system 101 can include a rack 103, which may correspond to a server rack, for example. The rack 103 can include vertical members, horizontal members, and/or any other suitable structure for supporting other components relative to the rack 103.

The system 101 may include a chassis 105. The chassis 105 may be slidable relative to the rack 103, such as slidably receivable in rack 103. For example, the chassis 105 may include or be coupled with suitable sliding rails 107 or other structure that can facilitate sliding of the chassis 105 relative to the rack 103. The chassis 105 can include a base (e.g., a substantially flat bottom with upturned sides), a lid (e.g., a substantially flat top with downturned sides), and/or any other suitable structure for supporting and/or containing other components. The base, lid, and/or other parts of the chassis 105 can be coupled together to form a box in which other components may be located and/or from which other components may extend, for example.

Suitable structure may be included for receiving one or more appliances 109. For example, two appliances 109 are shown relative the chassis 105 in FIG. 1, although any suitable number may be utilized. The appliances 109 can correspond to server blades or other computing equipment. Non-limiting examples may include servers, network switches, routers, or other units suitable for use in a datacenter or other computing environment.

One or more drawers 111 may be included. For example, two drawers 111 are shown relative the chassis 105 in FIG. 1, although any suitable number may be utilized (and may match a number of appliances 109 to be simultaneously received in the chassis 105). Structure may be included on the drawers 111 for accommodating the appliances 109 and causing appliances 109 to be appropriately seated or coupled with other structures in the chassis 105. The drawers 111 may provide structure that may be suitable for receiving appliances 109 without including features on the appliances 109 for engaging other coupling structure. For example, the appliances 109 may be generally block-like in nature and/or may represent substantially prismatic volumes. The appliances 109 may be received by the drawers 111 and/or other suitable structure borne by the chassis 105 to allow the appliances 109 to be introduced, received, and/or installed without having additional hardware being pre-installed on the appliances 109. For example, suitable coupling structures may be installed on the drawers 111 instead of including coupling structures on the appliances 109. Including coupling structures on the drawers 111 instead of on the appliances 109 may allow appliances 109 to be utilized as provided from a supplier, rather than incurring extra operations and/or time to reconfigure for mating coupling structures that may be already present on the chassis 105. Thus, the drawers 111 may allow simpler and/or more rapid deployment than arrangements that instead involve coupling structures provided on appliances 109.

The drawer 111 may be reconfigurable between different states. Examples of the different states may be best appreciated by reference to the different drawers 111 in FIG. 1. By way of example, as illustrated by the drawer 111 at right in FIG. 1, the drawer 111 may be configured into an open, extended, and/or deployed state 113. By way of further example, as illustrated by the drawer 111 at left in FIG. 1, the drawer 111 may be configured into a closed, retracted, and/or stowed state 115. The drawer 111 may include a front portion 117, which may extend from the chassis 105 in the deployed state 113 and/or may be received into the chassis 105 in the stowed state 115.

The drawer 111 can be suitably sized for introducing, installing, and/or receiving the appliance 109. For example, the drawer 111 is shown ready to receive the appliance 109 in the deployed state 113 in FIG. 1, and the appliance 109 is shown received in the stowed state 115 in FIG. 1.

The chassis 105 can further include a connector 119. The connector 119 can include a suitable set of one or more projections and/or recesses that may engage suitable mating structure on the appliance 109. The connector 119 may facilitate transfer of data and/or power, for example. Suitable examples of the connector 119 can include a Serial Advance Technology Attachment (SATA), a Serial attached SCSI (SAS) connector, Parallel-ATA (PATA), Peripheral Component Interconnect (PCIE), or another variety of connector. In use, the drawer 111 can allow the appliance 109 to be received in a suitable position for engagement with the connector 119 and operation, such as without including separate structure and/or fasteners on the appliance 109. For example, suitable structures can be included on the drawers 111 rather than on the appliances 109 to permit seating of the appliance 109. An amount of time for installing appliances 109 may be reduced by reducing an amount of structure to be installed on the appliance 109 and instead providing structures that the appliance 109 can simply be installed into without modification of the appliance 109 beyond a state as provided by a supplier. Some examples of coupling structure that may be included with the drawer 111 to this end are described in greater detail with respect to FIG. 2.

Figure 2:
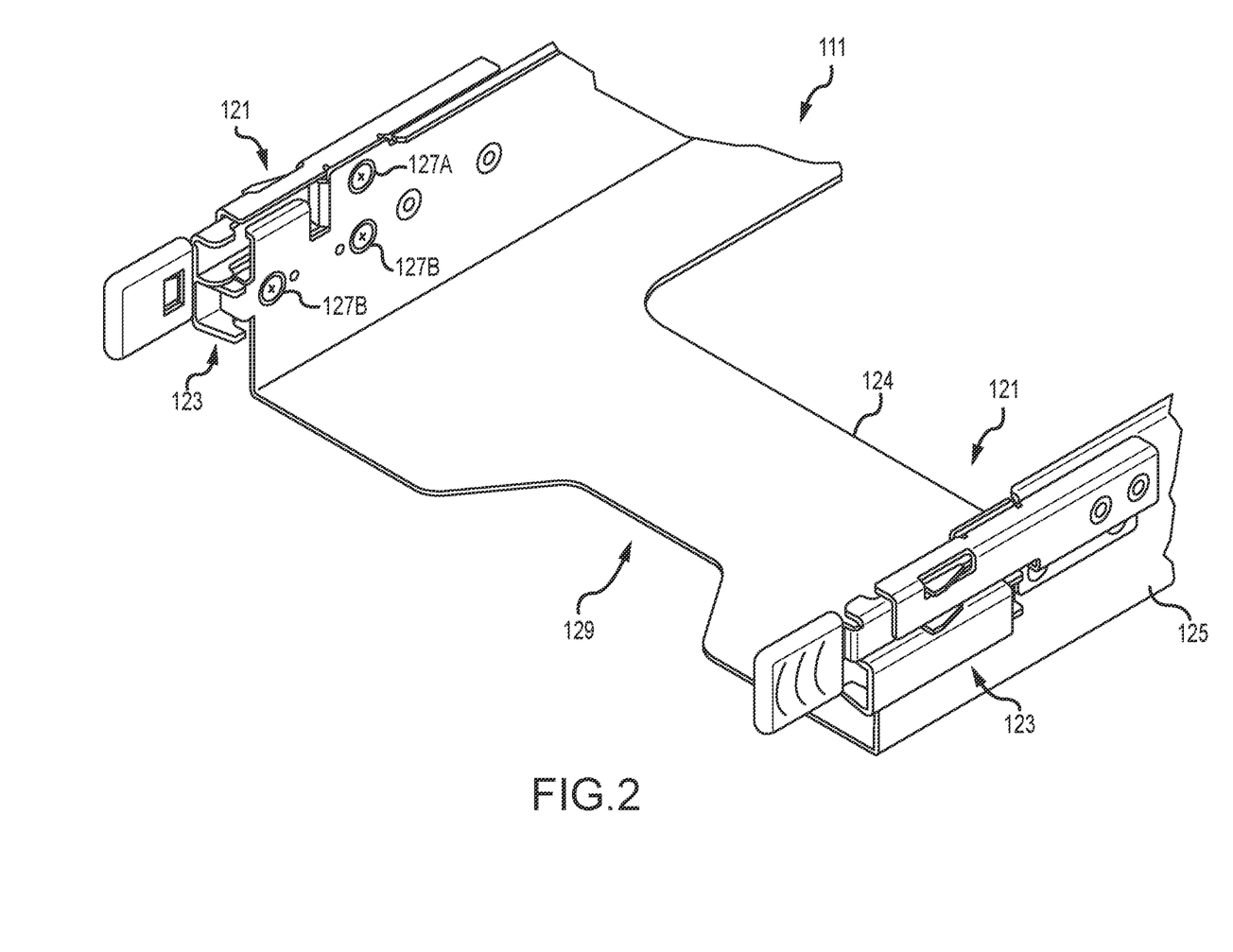
FIG. 2 illustrates a portion of a drawer that may be utilized in the system of FIG. 1, in accordance with various embodiments.

FIG. 2 is a perspective view of a portion of the drawer 111 in accordance with various embodiments. The drawer 111 and associated structure may be provided individually as an insert or kit to install relative to the chassis 105 in use and/or may be provided preassembled in the chassis 105 and/or larger assembly that may include the rack 103 and/or other structure of the system 101 in use. In some arrangements, the drawer 111 may be provided with an appliance 109 pre-installed or may be provided independent of an appliance 109.

The drawer 111 can include a drawer latch 121 and an appliance latch 123. Generally, the drawer latch 121 may function to secure the drawer 111 relative to structure of the chassis 105. For example, the drawer latch 121 may be actuatable to release the drawer 111 from being retained in the chassis 105 and to release the drawer 111 for movement from the stowed state 115 toward the deployed state 113. In comparison, the appliance latch 123 can provide suitable structure for securing the appliance 109 within the drawer 111 in use. For example, the appliance latch 123 may be actuatable in response to movement of the drawer 111 from the stowed state 115 toward the deployed state 113 to move from a secure state in which the appliance latch 123 at least partially blocks access out of the interior volume of the drawer 111 and to an accessible state in which the appliance latch 123 permits access out of the interior volume of the drawer 111.

In FIG. 2, respective identical instances of the drawer latch 121 and the appliance latch 123 are shown on each lateral side of the drawer 111 (e.g., left side and right side). However, instances may be the same or different from one another and/or may be omitted. For example, although two each of the drawer latch 121 and the appliance latch 123 are shown on left and right sides in FIG. 2, one, two, or any other suitable number may be utilized on any suitable surface. In non-limiting examples, the drawer latch 121 may be included on either side or multiple sides of the drawer 111 and/or the appliance latch 123 can be included on either side or multiple sides of the drawer 111.

The drawer latch 121 and the appliance latch 123 can be coupled with an exterior 125 of a body 124 of the drawer 111. For example, fasteners 127A are shown attaching structure of the drawer latch 121 with the body 124 of the drawer 111 and fasteners 127B are shown arranged for connecting coupling structure of the appliance latch 123 with the body 124 of the drawer 111. Any suitable number of fasteners may be utilized.

The body 124 may define an interior volume that may be sized for holding the appliance 109, for example. The body 124 may be sized for receiving the appliance 109 in any relative relationship with the body 124, including, but not limited to protruding across, being flush with, and/or being recessed from one or more edges. In some examples, the body 124 of the drawer 111 includes a notch 129, such as along a front of a base of the drawer 111. The notch 129 can be sized to facilitate grasping along the underside of appliance 109 by a user's thumb, for example. The body 124 can be formed of sheet-metal or any other suitably robust load-bearing material.

The drawer latch 121 and the appliance latch 123 may include suitable structure for accomplishing their respective functions. Some examples of suitable structure are discussed in greater detail with respect to FIG. 3A through FIG. 4B.

Figure 3A:
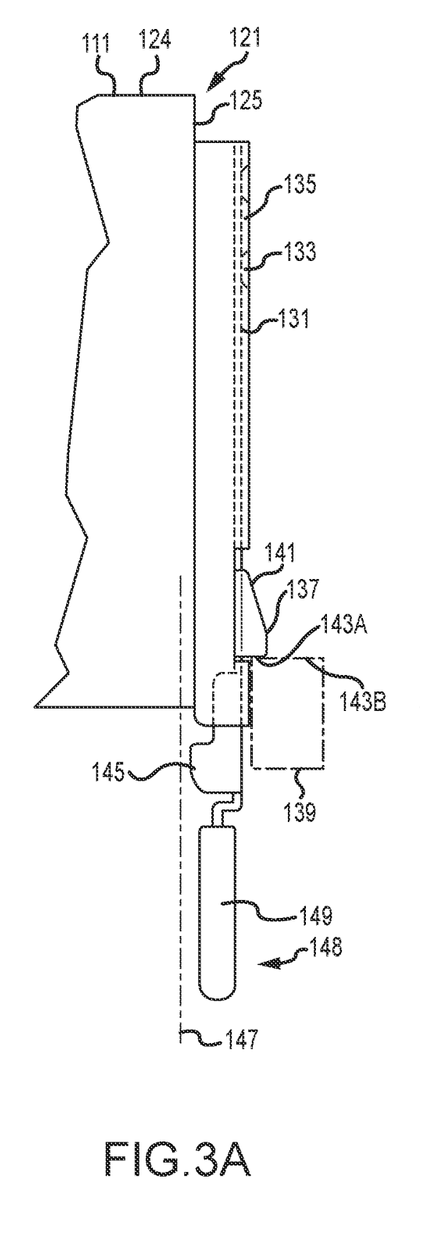
FIGS. 3A and 3B illustrate examples of different states of a drawer latch that can be implemented relative to the drawer of FIG. 2, in accordance with various embodiments.

FIG. 3A shows an example of the drawer latch 121 in a home state 148 (which may correspond to an at rest or non-actuated state). The drawer latch 121 may include a flexible arm 131. The flexible arm can be mounted by fasteners 133 to a housing 135 that may be coupled to sidewall or exterior 125 of the body 124 of the drawer 111 in use. Although shown with the housing 135 that may be attached to the drawer 111, the flexible arm 131 may be directly attached to the drawer 111 in use in some instances. The flexible arm 131 may be formed of suitably flexible and resilient material to allow the bending or flexing in response to actuation and returning to a starting state in use. As one example, the flexible arm 131 may be capable of moving between the position shown in FIG. 3A (e.g., a home state 148) and the position shown in FIG. 3B (e.g., a laterally offset configuration). The flexible arm 131 and/or other portion of the drawer latch 121 can include a handle 149 to facilitate actuation, for example.

The drawer latch 121 can include a prong 137. The prong 137 may be biased by the flexible arm 131 into engagement with a drawer catch surface 139 in the home state 148. The drawer catch surface 139 may correspond to a bounding wall that bounds a portion of a receiving area for the drawer 111 and/or may correspond to some other projection that may be supported by the chassis 105.

The prong 137 may include an inclined surface or ramped surface 141 that may be moved along the drawer catch surface 139 in use (such as during closing movement of the drawer 111 from the extended state 113 to the stowed state 115). The prong 137 may include an abutting surface 143A that may extend laterally and may contact a corresponding abutting surface 143B of the drawer catch surface 139. The flexible arm 131 can bias the prong 137 into engagement with the drawer catch surface 139, such as to retain the drawer 111 in the stowed state 115.

The drawer latch 121 can further include a front leg 145 that may extend laterally inward. For example, the front leg 145 may extend away from the prong 137. The front leg 145 may arranged to extend toward at least a portion of the interior volume defined by drawer body 124 in the home state 148 and/or at least across a portion of the interior volume defined by drawer body 124 in the laterally offset configuration 150. For example, the front leg 145 in the unactuated or home state 148 may project laterally inward without crossing a reference plane 147 that can correspond to an edge of an opening through which an appliance 109 is to be received in use. The drawer latch 121 may be actuated in use, such as from the position shown in FIG. 3A to the position shown in FIG. 3B.

Figure 3B:
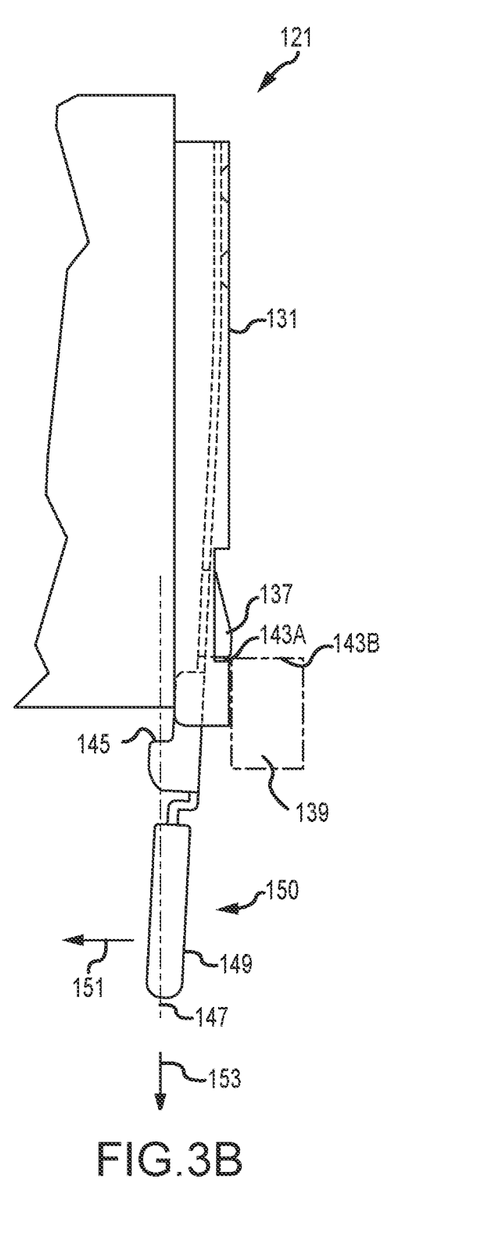

FIG. 3B shows a top view of the drawer latch 121 in an actuated state 150 in accordance with various embodiments. In the actuated state 150, the prong 137 may be disengaged from the drawer catch surface 139, e.g., such that the abutting surfaces 143A and 143B are out of contact with one another. The handle 149 may be actuated to the laterally offset state 150, e.g., by moving in the direction shown by arrow 151, which may to correspond to movement substantially in a laterally inward direction. The movement of the drawer latch 121 in actuating may cause the front leg 145 to at least partially extend across reference plane 147. For example, the front leg 145 may be positioned such that when the handle 149 is actuated laterally inward (such as shown in FIG. 3B), the front leg 145 is arranged at least partially blocking the path of the computing appliance 109 out of the drawer 111.

With the handle 149 in the laterally offset state 150 shown in FIG. 3B, the handle 149 may be pullable or pulled in a longitudinal direction, such as shown by arrow 153. Such motion may facilitate and/or impart movement of the drawer 111 from the stowed state 115 toward the deployed state 113. For example, with the abutting surface 143A of the prong 137 of the drawer latch 121 out of engagement with the abutting surface 143B of the drawer catch surface 139 due to the handle 149 being in the laterally offset state 150, the drawer latch 121 may enable or facilitate movement in the longitudinal direction 153, e.g., such that the prong 137 can move past the drawer catch surface 139 to move the drawer 111 from stowed state 115 toward the extended state 113.

Overall, the drawer 111 may be actuatable in a two-part actuation. The two-part actuation can include an initial lateral movement such as illustrated by arrow 151. Such lateral movement may move the flexible arm 131 enough to remove the prong 137 from the drawer catch surface 139 and release the drawer 111 for movement. The two-part actuation can further include a subsequent longitudinal movement, such as shown by arrow 153. The longitudinal movement 153 may move the drawer 111 from the stowed state 115 and toward the deployed state 113.

Figure 4A:
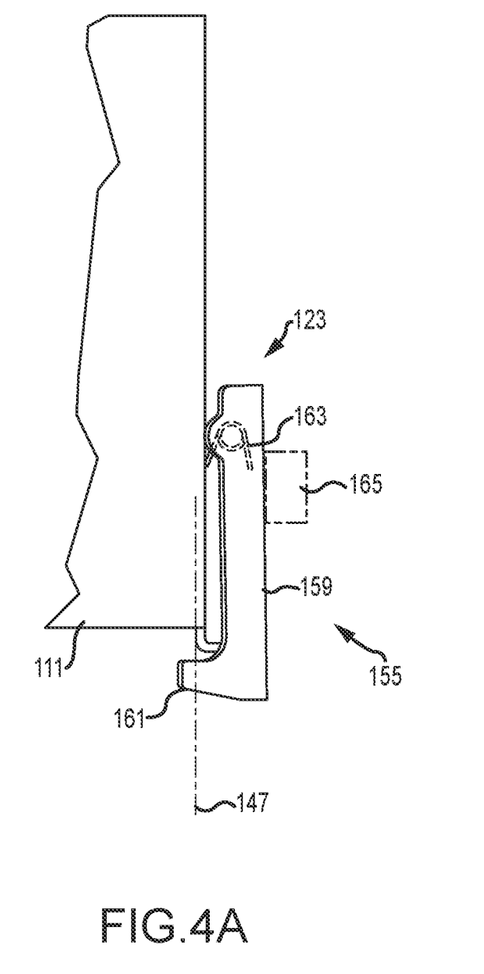
FIGS. 4A and 4B illustrate examples of different states of an appliance latch that can be implemented relative to the drawer of FIG. 2, in accordance with various embodiments.
Figure 4B:
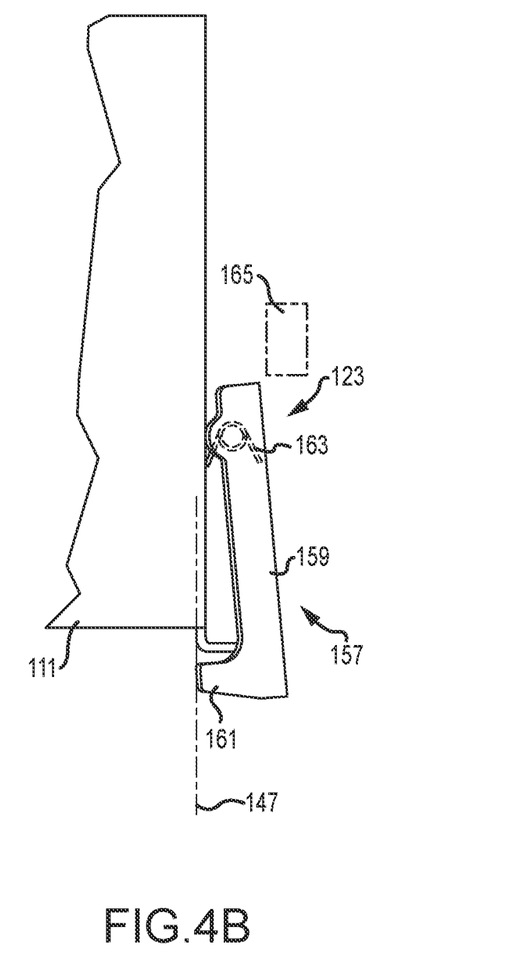

FIG. 4A illustrates a top view of a portion of the appliance latch 123 in a secured state 155. FIG. 4B illustrates a top view of the appliance latch 123 in an accessible state 157.

The appliance latch 123 can include an elongate member 159. The elongate member 159 can bear a tooth 161.

The elongate member 159 can be equipped with a biasing member 163. The biasing member 163 can include a torsional spring or other suitable form of spring or other biasing structure. The biasing member 163 can be coupled with the elongate member 159.

The appliance latch 123 can be movable into and/or from a secured state 155 in which tooth 161 retains the appliance within the drawer 111. For example, this may correspond to the tooth 161 extending across the reference plane 147 and/or otherwise blocking access out of the interior volume of the drawer 111. The biasing member 163 may bias the tooth 161 toward the accessible state 157. For example, in the accessible state 157, the tooth 161 may be laterally offset from and/or laterally outward from the reference plane 147, which may correspond to permitting access out of the interior volume of drawer 111.

The appliance latch 123 is also shown relative to a holding surface 165 in FIGS. 4A and 4B. The holding surface 165 may correspond to a wall, a projection, or other suitable structure that may be positioned in the chassis 105 alongside the drawer 111 in the stowed state. The holding surface 165 may be arranged to hold the elongate member 159 against the biasing force of biasing member 163 with the drawer 111 in the stowed state 115. This may retain the tooth 161 in the secured state 155 such that the appliance 109 is secured by the tooth 161 at least partially blocking access out of the interior volume of the drawer 111.

Movement of the drawer 111 (such as during opening movement of the drawer 111 toward the extended state 113 from the stowed state 115) may permit the elongate member 159 to move beyond the holding surface 165 such that the biasing member 163 moves the tooth 161 from the secured state 155 to the accessible state 157, which may enable the removal or exiting of the appliance 109 from the drawer 111, e.g., past the tooth 161.

Figure 5:
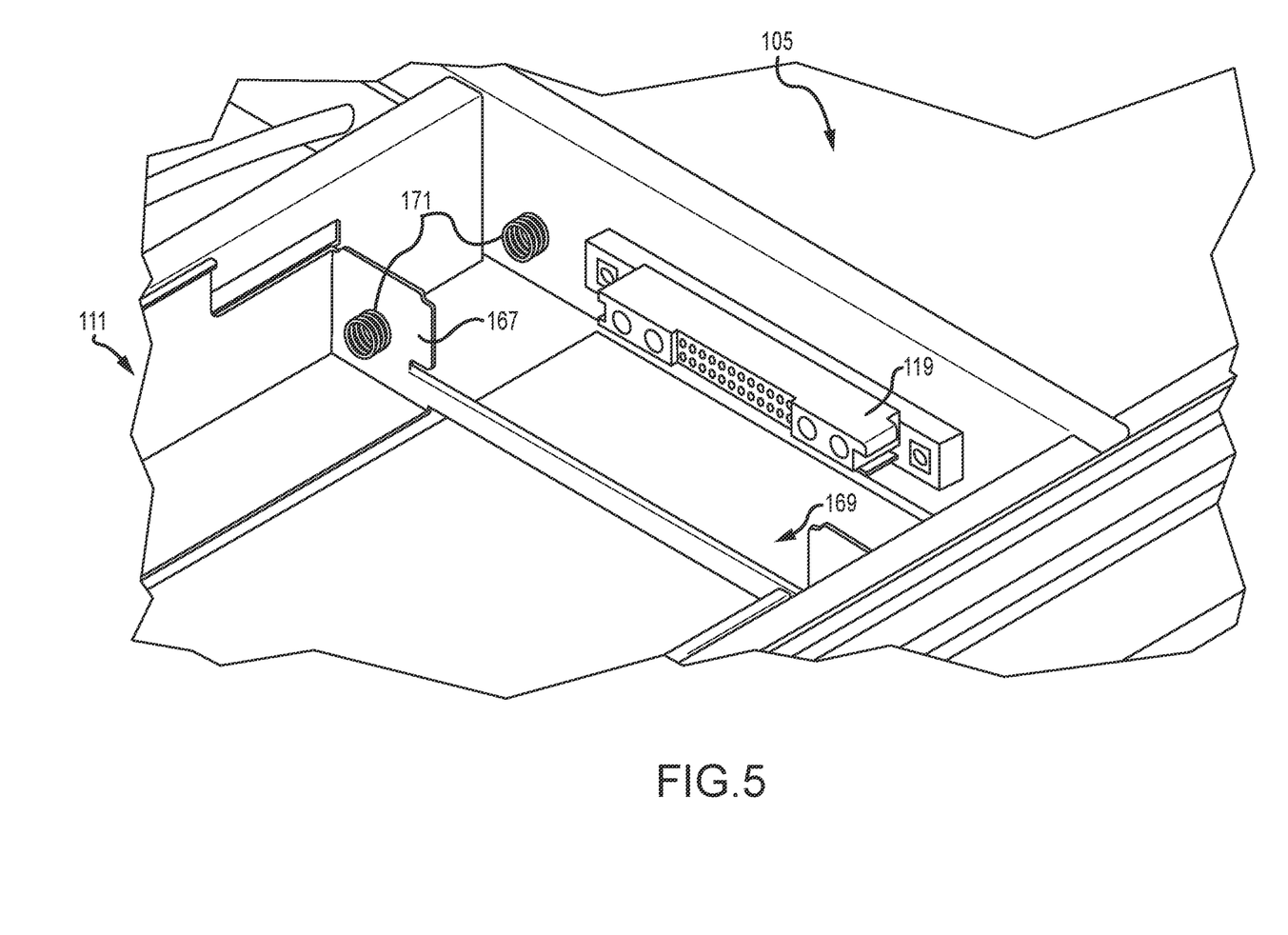
FIG. 5 illustrates example of features that may be implemented along a rear portion of the drawer of FIG. 2, in accordance with various embodiments.

FIG. 5 illustrates a perspective view of a portion of the drawer 111. The rear of the drawer 111 may include a rear wall 167. The rear wall 167 can include a gap 169. The gap 169 may be sized to permit movement of the connector 119 through the gap 169. With the drawer 111 in the stowed state 115, the connector 119 may extend through the gap 169 and can engage with the appliance 109.

In some embodiments, the drawer 111 and/or corresponding portion of the chassis 105 can include an ejection assistance device 171. The ejection assistance device 171 is shown as a set of springs although any form and/or number of like or differing biasing mechanism may be utilized. The ejection assistance device 171 is shown with a spring on an interior surface of the rear wall 167 of the drawer 111, e.g., such that the ejection assistance device 171 may facilitate or provide additional force for ejecting the appliance 109 in use. The ejection assistance device 171 in FIG. 5 is also shown with a spring that can provide force against the rear wall 167, such as for pushing the rear wall 167 away from a portion of the chassis 105. Although the ejection assistance device 171 is shown with a biasing mechanism extending from the chassis 105 to push against the rear wall 167, the ejection assistance device 171 may include a spring or other biasing structure extending from the rear wall 167 and facing toward the chassis 105, extending from the chassis 105 and facing toward the rear wall 167, or both.

Figure 6:
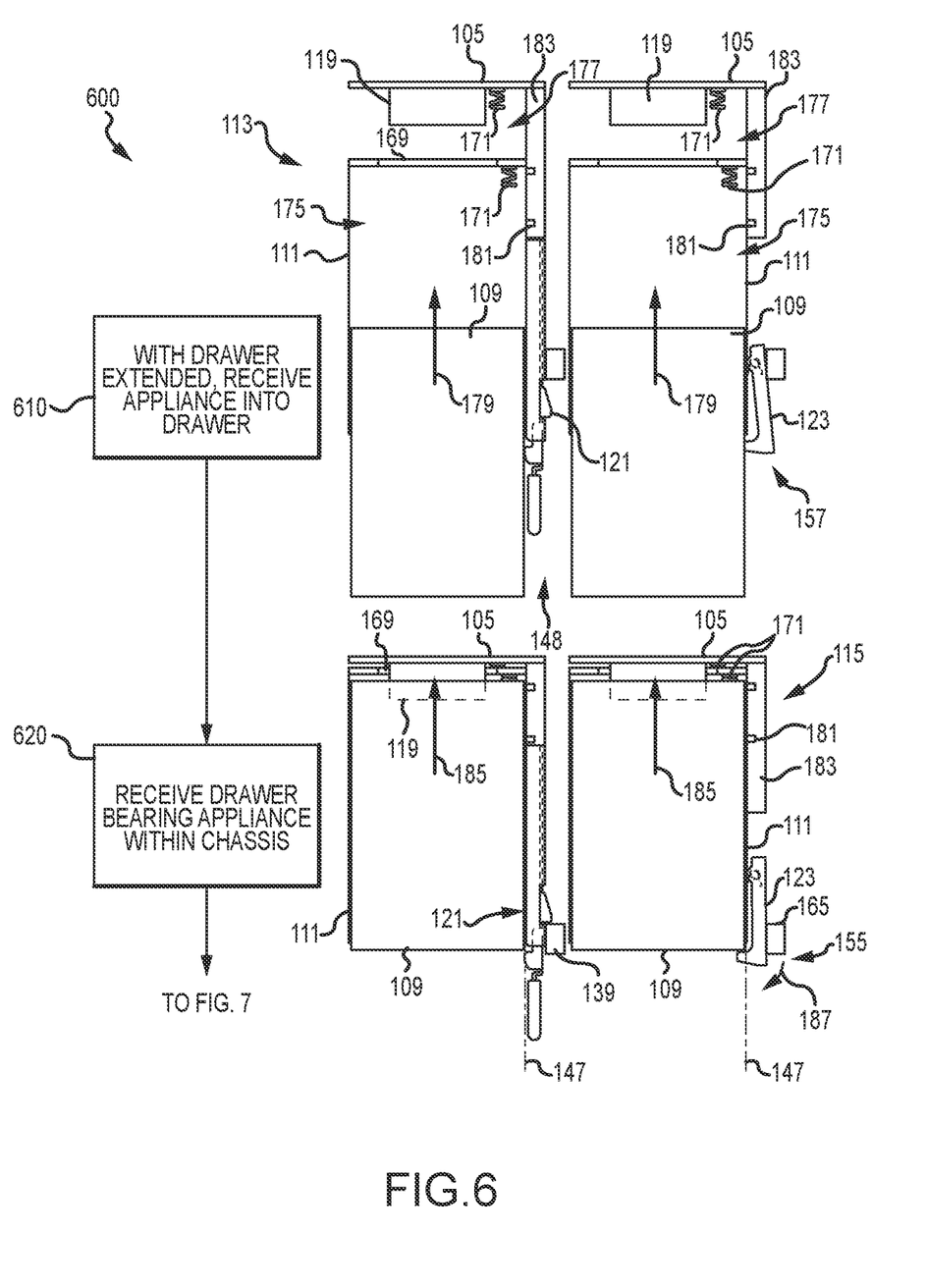
FIGS. 6, 7, and 8 illustrate examples of operations that may be included in a process that may be performed relative to the system of FIG. 1, in accordance with various embodiments.
Figure 7:
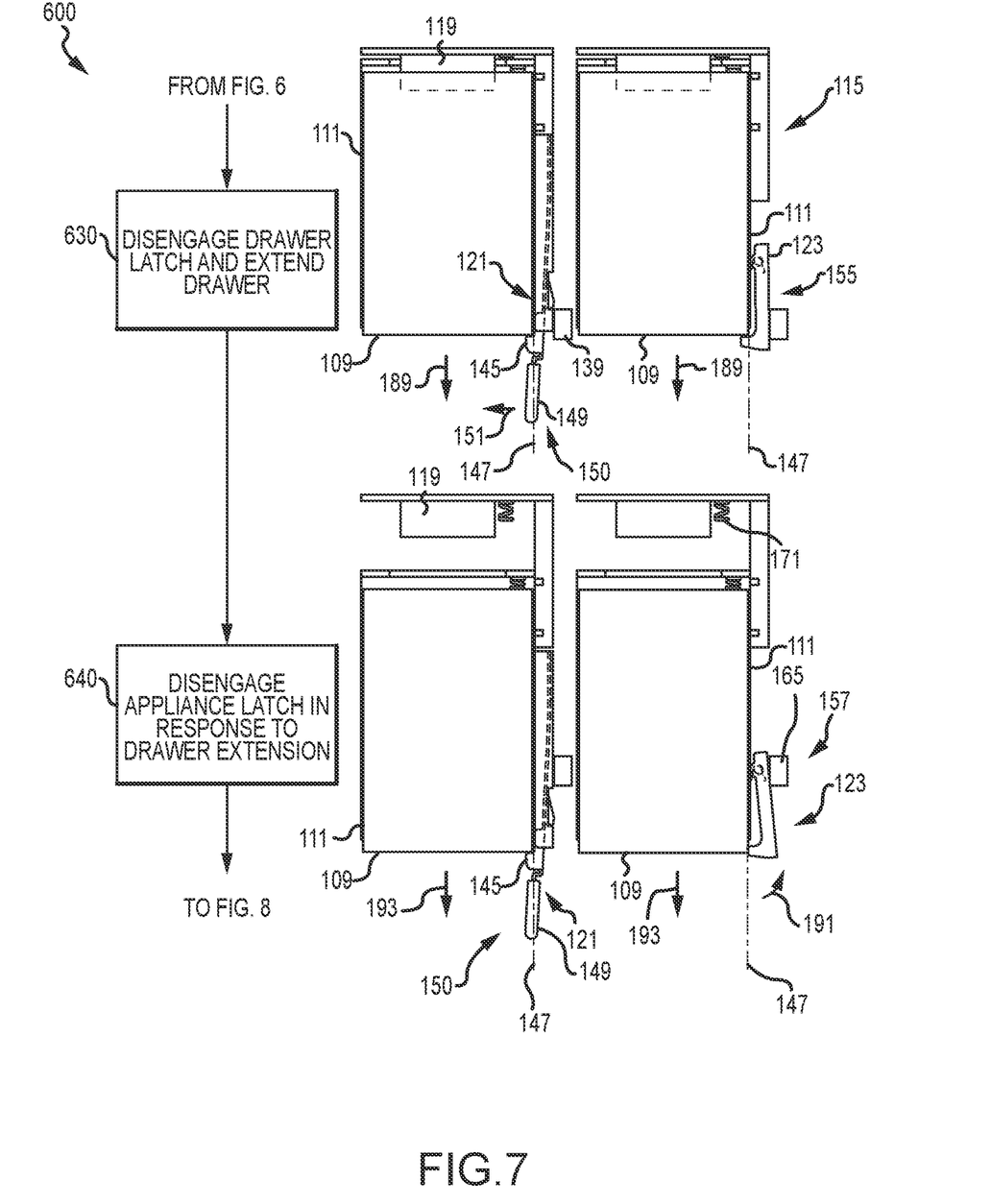
Figure 8:
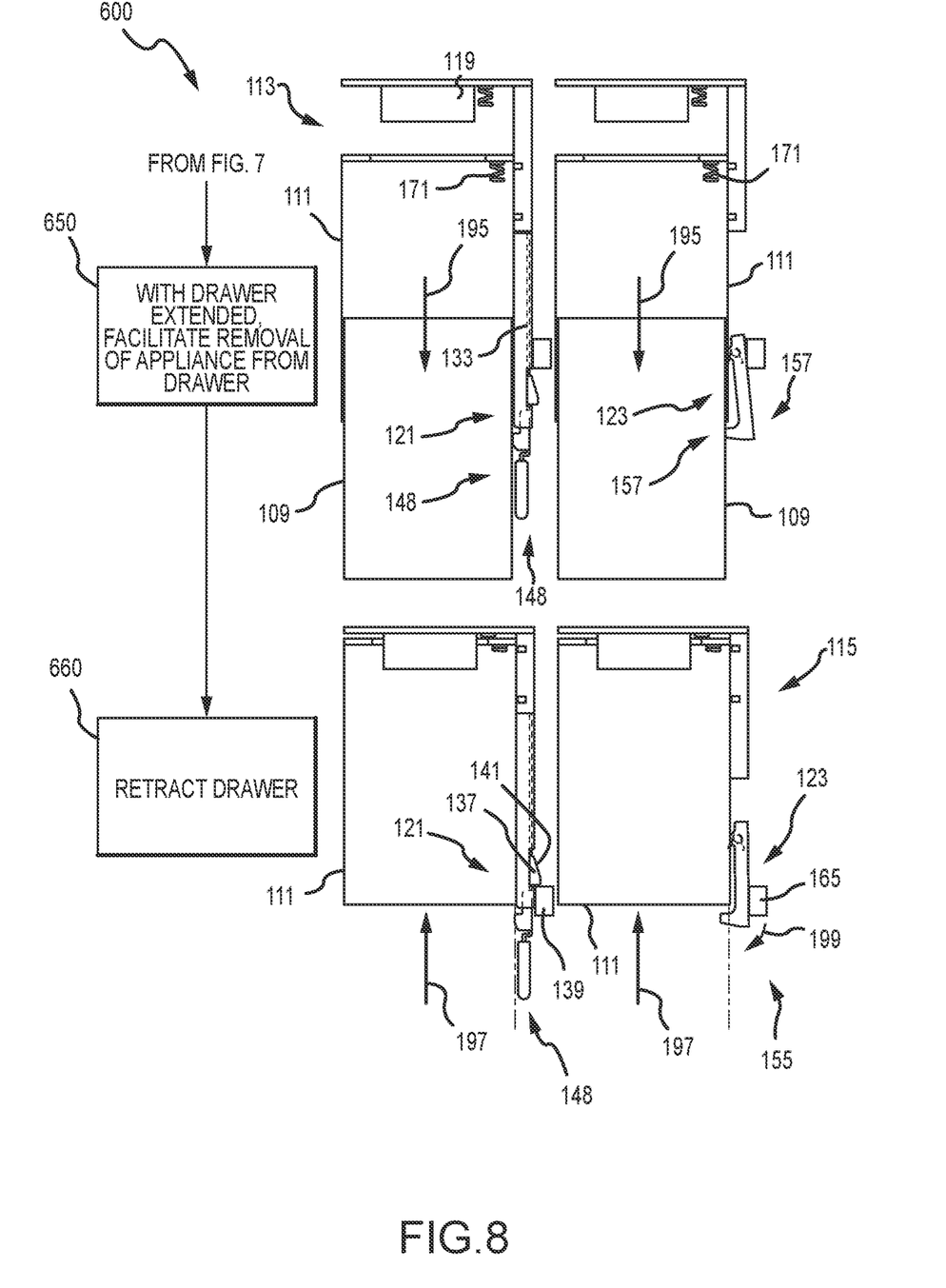

FIGS. 6, 7, and 8 show operations that may be included in a process 600 that may be performed relative to the system 101. The operations may correspond to actions performed by elements of the system 101 and/or by operators of the system. The operations are identified relative to blocks shown at left, while examples of structures and/or states that may be relevant to such operations are depicted at right in these figures (although other structures may be utilized additionally or alternatively). In particular, the depictions at right each include two views, which include one view showing the drawer latch 121 and an adjacent view showing the appliance latch 123. Although the drawer latch 121 and the appliance latch 123 may be arranged one over the other on a single drawer 111 in use, separate views of each are provided for the sake of ease of viewing of each element.

The process 600 at 610 may include, with the drawer extended, receiving an appliance 109 into the drawer 111. This may correspond to the drawer 111 being in the extended state 113. In the extended state 113, the drawer latch 121 may be in the home state 148, while the appliance latch 123 may be in the accessible state 157. Both the drawer latch 121 and the appliance latch 123 may be suitably positioned to allow the appliance 109 to be inserted into an interior volume 175 of the drawer 111.

An internal volume 177 of the chassis 105 can be at least partially occupied and at least partially unoccupied by the drawer 111 in the extended state 113 of the drawer 111. For example, as shown in FIG. 6 alongside operation 610, the internal volume 177 of the chassis 105 can receive and/or include at least a portion of the drawer 111. Insertion of the appliance 109 into the interior volume 175 of the drawer 111 may be represented by the arrow 179.

Other features are also shown in FIG. 6 alongside operation 610, including the connector 119, ejection assistance devices 171, and the gap 169 in the drawer 111. Also shown are wheels 181, which may ride along a track 183 to facilitate movement of the drawer 111 relative to the chassis 105, for example, although other structures additionally or alternatively may be used to enable the drawer 111 to be slidable relative to the chassis 105.

At 620, the process 600 can include receiving the drawer 111 bearing the appliance 109 within the chassis 105. For example, this may correspond to movement represented by arrow 185, e.g., moving from the extended state 113 toward the stowed state 115. Various elements may shift position and/or states in response to the drawer 111 being received. For example, in the stowed state 115, the wheels 181 may be in a different position along the track 183. Additionally or alternatively, in response to receiving the drawer 111, the ejection assistance device 171 may be compressed to apply a preload (e.g., that may be subsequently utilized for providing energy for propelling the drawer 111 and/or the appliance 109). Additionally or alternatively, in the stowed state 115 of the drawer 111, the connector 119 may extend through the gap 169 and be engaged with the appliance 109.

Moving from the extended state 113 toward the stowed state 115 (such as illustrated by arrow 185) may cause the drawer latch 121 to move past the drawer catch surface 139. For example, with respect to features identified in FIGS. 3A and 3B, this may correspond to the ramped surface 141 of the prong 137 riding along the catch surface 139 to cause temporary laterally inward deflection against a bias from the flexible arm 131, followed by a subsequent laterally outward return imparted by the flexible arm 131 to bring the abutting surfaces 143A and 143B into engagement that retains the drawer 111 within the stowed state 115. For example, the drawer latch 121 may temporarily cross the reference plane 147 while flexing inward due to interaction with the drawer catch surface 139 and may return to a position laterally outward of the reference plane 147 afterward.

Moving from the extended state 113 toward the stowed state 115 (such as illustrated by arrow 185) may also impact the appliance latch 123. Such closing movement of the drawer 111 may cause the appliance latch 123 to move from the accessible state 157 to the secured state 155. For example, during closing movement of the drawer 111, the appliance latch 123 may reconfigure in response to the holding surface 165 interacting with the appliance latch 123 (such as in a camming manner) to rotate or otherwise move the appliance latch 123 (such as depicted by arrow 187). For example, with respect to features identified in FIGS. 4A and 4B, this may correspond to the elongate member 159 of the appliance latch 123 coming into contact with the holding surface 165 and being pushed in rotation to move the tooth 161 to a state extending across the reference plane 147 and at least partially across a front opening of the drawer 111 to retain the appliance 109 therein (e.g., moving from the accessible state 157 to the secured state 155). The holding surface 165 can hold the appliance latch 123 in the secured state 115 during the time that the drawer 111 remains in the stowed state 115, for example.

FIG. 7 shows further operations that may be utilized in the process 600. For example, the process 600 can continue or include at 630 disengaging the drawer latch 121 (such as disengaging from the drawer catch surface 139). For example, the handle 149 may be actuated laterally (such as depicted by arrow 151). The appliance latch 123 can remain in the secured state 155 as the drawer latch 121 is moved to the actuated state 150. Actuating may include moving the handle 149 and/or the drawer latch 121 to the laterally offset state 150. Actuation may reconfigure the drawer latch 121 to be out of engagement with the drawer catch surface 139. With the drawer latch 121 disengaged, the drawer 111 may be released to permit extension, which may be represented by arrow 189.

Actuating the drawer latch 121 may move the front leg 145. For example, moving the handle 149 and/or the drawer latch 121 to the laterally offset state 150 may move the front leg 145 across the reference plane 147 and into position at least partially blocking an opening across a front of the drawer 111. From this position, the front leg 145 may be positioned to at least partially retain the appliance 109 within the drawer 111 during extension 189.

During extension 189, the connector 119 may be disengaged from the computing appliance 109. For example, moving away from the stowed state 115 shown alongside operation 630 may cause the connector 119 to disengage from the appliance 109, such as to a disconnected state shown in the position alongside operation 640 and/or operation 650.

At 640, the process 600 can include disengaging the appliance latch 123 in response to extension of the drawer 111. Disengaging the appliance latch 123 may correspond to moving from the secured state 155 to the accessible state 157, such as depicted by arrow 191. The appliance latch 123 may move to the accessible state 157 in response to movement past and/or out of engagement with the holding surface 165 as the drawer is extended or moved from the stowed state 115 to the extended state 113 (such as depicted by arrow 193).

The ejection assistance device 171 may provide at least some force to augment or facilitate movement for extension of the drawer 111. The drawer 111 may continue to move forward (such as illustrated by arrow 193) with the drawer latch 121 still in the actuated state 150. For example, a user may continue to pull the handle 149 inward laterally (as at arrow 151 in FIG. 3B) while also pulling the handle 149 longitudinally (as at arrow 153 in FIG. 3B). Keeping lateral pressure on the handle 149 may cause the front leg 145 to remain in position extending across at least a portion of a front of the appliance 109 during longitudinal movement and may provide a barrier against the appliance 109 exiting from the drawer 111 due to inertia during extension of the drawer 111 in use when the appliance latch 123 has already been actuated to the accessible state 157 from extension of the drawer 111, for example.

FIG. 8 shows additional operations that may be included in the process 600. At 650, the process 600 can include, with the drawer 111 extended, facilitating removal or exiting of the appliance 109. For example, the appliance 109 may exit or be removed from the drawer 111, such as depicted by arrow 195. Removal or exiting may be accomplished by an operator pulling on the appliance 109 and/or in response to force provided by the ejection assistance device 171. In use, the operator may release the handle 149 to grip the appliance 109, which may allow the drawer latch 121 to return to the home state 148 (such as based on the biasing effect from the flexible arm 131). With the drawer 111 in the extended state 113, the appliance latch 123 may be in the accessible state 157 and the drawer latch 121 can be in the home state 148, e.g., which may each facilitate movement of the appliance 109 past and/or without interference with those structures during removal of the appliance 109 from the drawer 111.

At 660, the drawer 111 can be retracted, e.g., to the stowed state 115. Retracting the drawer 111 (e.g., as at arrow 197) can cause the appliance latch 123 to engage the holding surface 165 and rotate or otherwise move (as at arrow 199) to the secured state 155. The drawer latch 121 may be in the home state 148 before and/or after retraction of the drawer 111. During retraction of the drawer 111, the drawer latch 121 may flex to engage the drawer catch surface 130, e.g., such that the prong 137 can ride along the drawer catch surface 139 due to the ramped surface 141 moving in engagement with the drawer catch surface 139 during movement of the retraction illustrated by arrow 197.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computing system assembly, comprising:
   a chassis slidably receivable in a rack;
   a drawer slidable in the chassis between a deployed state and a stowed state, the drawer having a front portion extending from the chassis in the deployed state and received into the chassis in the stowed state;
   a computing appliance received in the drawer;
   a drawer catch surface supported by the chassis;
   a drawer latch comprising a flexible arm and a prong biased by the flexible arm into engagement with the drawer catch surface to retain the drawer in the stowed state;
   an appliance latch having an elongate member, a spring coupled with the elongate member, and a tooth borne on the elongate member, the appliance latch moveable between a secure state, in which the tooth retains the computing appliance within the drawer, and an accessible state, in which the computing appliance is removable from the drawer past the tooth;
   a holding surface positioned in the chassis alongside the drawer in the stowed state and arranged to hold the elongate member against a biasing force of the spring with the drawer in the stowed state so as to retain the computing appliance in the secured state; and
   a handle coupled with the drawer latch and actuatable in a two part actuation that includes an initial lateral movement to move the flexible arm to remove the prong from the drawer catch surface and a subsequent longitudinal movement to move the drawer from the stowed state to the deployed state and permit the elongate member to move beyond the holding surface such that the spring moves the tooth from the secured state to the accessible state to enable removal of the computing appliance from the drawer.

2. The computing system assembly of claim 1, further comprising a connector positioned within the chassis and engaged with the computing appliance with the drawer in the stowed state and disengaged from the computing appliance with the drawer in the deployed state.

3. The computing system assembly of claim 2, wherein the drawer includes a rear wall having a gap through which the connector extends into engagement with the computing appliance with the drawer in the stowed state.

4. The computing system assembly of claim 1, wherein the drawer latch further comprises a front leg, wherein with the handle actuated laterally inward, the front leg is arranged at least partially blocking a path of the computing appliance out of the drawer.

5. A computing system assembly, comprising:
   a drawer having a drawer body defining an interior volume sized for holding a computing appliance, the drawer configured to be slidable between a deployed state and a stowed state relative to a rack-mountable chassis slidably receivable in a rack;
   a drawer latch coupled with an exterior of the drawer and actuatable to release the drawer from being retained in the chassis and to release the drawer for movement from the stowed state toward the deployed state; and
   an appliance latch coupled with the exterior of the drawer and actuatable in response to movement of the drawer from the stowed state toward the deployed state to move from a secure state in which the appliance latch at least partially blocks access out of the interior volume of the drawer and to an accessible state in which the appliance latch permits access out of the interior volume of the drawer, the drawer latch movable in a lateral direction to a laterally offset configuration to release the drawer.

6. The computing system assembly of claim 5, further comprising the computing appliance.

7. The computing system assembly of claim 5, further comprising the chassis.

8. The computing system assembly of claim 5, further comprising a handle coupled with the drawer latch, the handle being actuatable in the lateral direction to the laterally offset configuration to release the drawer, the handle further being pullable in the laterally offset configuration to impart movement from the stowed state toward the deployed state.

9. The computing system assembly of claim 8, wherein the drawer latch is sized and shaped to at least partially block access out of the interior volume of the drawer with the handle in the laterally offset configuration.

10. The computing system assembly of claim 5, further comprising a biasing member arranged to bias the appliance latch toward the accessible state.

11. The computing system assembly of claim 5, wherein the drawer body comprises a rear wall defining a gap sized for permitting passage of a connector at least partially into the interior volume of the drawer.

12. The computing system assembly of claim 5, further comprising:

the chassis slidably receivable in a rack, wherein the drawer has a front portion extending from the chassis in the deployed state and received into the chassis in the stowed state;

a computing appliance received in the drawer;

a drawer catch surface supported by the chassis, wherein the drawer latch comprises a flexible arm and a prong biased by the flexible arm into engagement with the drawer catch surface to retain the drawer in the stowed state, wherein the appliance latch has an elongate member, a spring coupled with the elongate member, and a tooth borne on the elongate member, the appliance latch moveable between the secure state, in which the tooth retains the computing appliance within the drawer, and the accessible state, in which the computing appliance is removable from the drawer past the tooth;

a holding surface positioned in the chassis alongside the drawer in the stowed state and arranged to hold the elongate member against a biasing force of the spring with the drawer in the stowed state so as to retain the computing appliance in the secured state; and a handle coupled with the drawer latch and actuatable in a two part actuation that includes an initial lateral movement to move the flexible arm to remove the prong from the drawer catch surface and a subsequent longitudinal movement to move the drawer from the stowed state to the deployed state and permit the elongate member to move beyond the holding surface such that the spring moves the tooth from the secured state to the accessible state to enable removal of the computing appliance from the drawer.

13. A method of operation of a computing system assembly, the method comprising:

disengaging a drawer latch to release a drawer from being retained in a chassis by laterally moving the drawer latch to a laterally offset configuration, the drawer having a drawer body defining an interior volume sized for holding a computing appliance;

with the drawer latch disengaged, extending the drawer outward from the chassis, the extending including movement of the drawer from a stowed state toward a deployed state; and in response to the movement of the drawer from the stowed state toward the deployed state, disengaging an appliance latch, the disengaging the appliance latch including moving from a secure state in which the appliance latch at least partially blocks access out of the interior volume of the drawer and to an accessible state in which the appliance latch permits access out of the interior volume of the drawer.

14. The method of claim 13, wherein laterally moving the drawer latch to the laterally offset configuration comprises actuating a handle coupled with the drawer latch in a lateral direction to the laterally offset configuration.

15. The method of claim 13, wherein the extending the drawer outward from the chassis comprises longitudinal movement with the drawer latch in the laterally offset configuration.

16. The method of claim 13, further comprising, in response to the movement of the drawer from the stowed state toward the deployed state, disengaging the computing appliance from a connector borne by the chassis.

17. The method of claim 13, further comprising, with the appliance latch disengaged, exiting the computing appliance from the interior volume of the drawer.

18. The method of claim 13, further comprising, with the appliance latch disengaged, installing the computing appliance into the interior volume of the drawer.

19. The method of claim 13, further comprising, retracting the drawer into the chassis to cause engagement of the drawer latch that retains the drawer in the chassis and to cause engagement of the appliance latch that positions the appliance latch in the secure state.

20. The method of claim 19, further comprising, in response to the retracting the drawer into the chassis, engaging the computing appliance with a connector borne by the chassis.

* * * * *